(12) United States Patent
Zhong

(10) Patent No.: US 10,554,143 B2
(45) Date of Patent: Feb. 4, 2020

(54) SYNDEM CONVERTER—A POWER ELECTRONIC CONVERTER WITH ALL VOLTAGE AND CURRENT SENSORS CONNECTED TO A COMMON REFERENCE POINT

(71) Applicant: Qingchang Zhong, Willowbrook, IL (US)

(72) Inventor: Qingchang Zhong, Willowbrook, IL (US)

(*) Notice: Subject to any disclaimer, the term of this patent is extended or adjusted under 35 U.S.C. 154(b) by 0 days.

(21) Appl. No.: 16/236,485

(22) Filed: Dec. 29, 2018

(65) Prior Publication Data

US 2019/0341858 A1 Nov. 7, 2019

(30) Foreign Application Priority Data

May 3, 2018 (GB) .................................... 807264.5

(51) Int. Cl.
*H02M 5/458* (2006.01)
*G01R 1/20* (2006.01)
(Continued)

(52) U.S. Cl.
CPC .......... *H02M 5/4585* (2013.01); *G01R 1/203* (2013.01); *G01R 15/04* (2013.01); *H02J 3/383* (2013.01); *H02M 2001/0009* (2013.01)

(58) Field of Classification Search
CPC ....... H02M 5/4585; H02M 2001/0009; H02M 7/7575; G01R 15/04; G01R 1/203; H02J 3/383

(Continued)

(56) References Cited

U.S. PATENT DOCUMENTS 5,126,585 A * 6/1992 Boys ....................... H02J 9/062
307/45
5,654,591 A * 8/1997 Mabboux .................. H02J 9/06
307/64

(Continued)

*Primary Examiner* — Alex Torres-Rivera

(57) ABSTRACT

This invention discloses a power electronic converter that has a common reference point for the measurement of voltages and currents, making it possible to use non-isolated or isolated voltage and current sensors. The disclosed converter has an N-type power electronic conversion leg that consists of two sets of power electronic devices with their both ends connected to a capacitor to form a DC bus and their mid-point connected to the common reference point through an inductor and a current sensor. The disclosed converter has one or more power electronic conversion leg that consists of two sets of power electronic devices with the positive end connected to the positive rail of the DC bus and the negative end connected either to the common reference point N, in which case the power electronic conversion leg is denoted the A-type, or to the negative rail of the DC bus, in which case the power electronic conversion leg is denoted the B-type. For each present A-type or B-type power electronic conversion leg, its mid-point is connected to one terminal of the corresponding input/output port, together with a current sensor connected between the common reference point and the other terminal of the corresponding input/output port. The disclosed converter also has a capacitor connected to the positive rail of the DC bus and the common reference point through a current sensor. A storage system and/or a load can be connected in parallel with or in place of this capacitor. The disclosed converter can be used for DC/DC, AC/DC, DC/AC, and AC/AC conversion.

7 Claims, 3 Drawing Sheets

(51) Int. Cl.
*H02J 3/38* (2006.01)
*G01R 15/04* (2006.01)
*H02M 1/00* (2006.01)

(58) Field of Classification Search
USPC .......................................................... 363/35
See application file for complete search history.

(56) References Cited

U.S. PATENT DOCUMENTS

| | | |
|---|---|---|
| 6,271,633 B1 | 8/2001 | Shen |
| 2002/0180379 A1* | 12/2002 | Shen .................. H02M 5/4585 315/224 |
| 2003/0102818 A1* | 6/2003 | Shen .................. H05B 41/2886 315/291 |
| 2004/0217763 A1* | 11/2004 | Moore ..................... G01V 3/30 324/338 |
| 2004/0233688 A1* | 11/2004 | Okuma ..................... H02J 3/16 363/132 |
| 2006/0077701 A1 | 4/2006 | Baudesson |
| 2009/0251060 A1* | 10/2009 | Henze .................... H05B 41/28 315/246 |
| 2010/0296324 A1* | 11/2010 | Boeke ................. H02M 3/1582 363/127 |
| 2013/0128628 A1* | 5/2013 | Venhaus ................. H02M 7/49 363/34 |
| 2015/0256116 A1* | 9/2015 | Tateda ................. B60L 3/0061 318/504 |
| 2017/0025970 A1* | 1/2017 | Horst ..................... H02M 1/15 |
| 2018/0348285 A1* | 12/2018 | Drofenik ................ H01L 28/40 |

\* cited by examiner

SYNDEM CONVERTER—A POWER ELECTRONIC CONVERTER WITH ALL VOLTAGE AND CURRENT SENSORS CONNECTED TO A COMMON REFERENCE POINT

CROSS-REFERENCE TO RELATED APPLICATIONS

This nonprovisional patent application claims the benefit of and priority under 35 U.S. Code 119 (b) to U.K. Patent Application No. GB1807264.5 filed on May 3, 2018, entitled "SYNDEM Converter", the contents of which are all hereby incorporated by reference herein in its entirety.

TECHNICAL FIELD

This invention is concerned with power electronic converters. Possible application fields include renewable energy, such as wind, solar and wave energy, electrical vehicles, energy storage systems, aircraft power systems, different types of loads that require power electronic converters, data centers and so on.

BACKGROUND

Power systems are going through a paradigm change from centralized generation to distributed generation. More and more distributed energy resources (DERs), including renewables, electric vehicles, and energy storage systems, are being integrated into the grid through power electronic converters operated as inverters. The majority of loads will also be connected to the grid through power electronic converters operated as rectifiers. As a result, the fundamental challenge behind the paradigm change of power systems is that future power systems will be power electronics-based instead of electric machines-based. This presents unprecedented challenges to the stability and reliability of power systems. It has been shown that the SYNDEM (synchronized and democratized) grid architecture is able to unify and harmonize future power systems via operating these converters as virtual synchronous machines, bringing compatibility to current power systems and enhancing stability, reliability and resiliency. This solves the challenges at the systems level and enables millions of power electronic converters to work together. However, there are still a lot of challenges at the equipment level.

The design of power electronic converters is still a challenge. It requires multidisciplinary knowledge in power semiconductor devices, topology, electrical and electronic circuits, thermal management, mechanical design, control theory etc. Among them, adopting the right topology is vital for power density, EMI, thermal management and many other issues. Providing a common reference point is very beneficial in this regard. For example, U.S. Pat. No. 6,271,633 B1 discloses a single-phase back-to-back converter with a common neutral leg to provide a common reference point. US 2006/0077701 A1 extends this topology to a three-phase back-to-back converter with a common neutral leg to provide a common reference point. However, the mid-point of the common neutral leg in both cases is directly connected to the common reference point, causing large current ripples and making it difficult if not impossible to control the common leg independently. Indeed, it can be seen from the control block diagrams disclosed in US 2006/0077701 A1 that the controller for the common leg is coupled with the controller for the other legs. Another critical aspect of a power electronic converter that affects power density and cost is the measurement of voltages and currents and the arrangement of the corresponding sensors. Not enough attention has been paid to this aspect in the prior art. Indeed, neither U.S. Pat. No. 6,271,633 B1 nor US 2006/0077701 disclosed how the current sensors and the voltage sensors were connected. Conventionally, bulky and expensive isolated voltage and current sensors are often used.

A common way for measuring currents is to place current sensors directly in series with inductors. When plural current sensors are used in a power electronic converter, the current sensors do not have a common point. For example, current sensors Ls1 and Ls2 in FIG. 2 of US Pub. No. 2002/0180379 are connected between the inductors L1 and the mid-points Vx1 and between L2 and Vx2, respectively. The two current sensors are not connected directly and do not have a common point. These current sensors present a high common-mode voltage and require isolation for electronic control circuitry, which increases circuit complexity and cost.

A common way for measuring voltages is to place voltage sensors across the voltage to be measured. When plural voltage sensors are used in a power electronic converter, the voltage sensors do not have a common point. For example, paragraph 110 of US Pub. No. 2004/0233688, recites with regarding to FIG. 4 there that "the voltage detecting means 70 is provided for detecting the voltage $V_{in}$ at both ends of the AC power supply 1, a voltage $V_M$ ($V_{MN}$) at the point M based on the potential at the point N, a voltage $V_P$ ($V_{PN}$) at the point P based on the potential of the point N, and the voltage $V_{out}$." The voltages $V_{in}$ and $V_{out}$ are measured based on the potential of the neutral point of the AC power supply 1 and the load 6 while the voltages $V_M$ ($V_{MN}$) and $V_P$ ($V_{PN}$) are measured based on the potential at the point N. The four voltage sensors are not connected directly to a common reference point. These voltage sensors require isolation for electronic control circuitry as well, which increases circuit complexity and cost.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

This invention discloses a power electronic converter with a common leg that is connected to the common reference point through an inductor. Together with the capacitor that is connected between the positive rail of the DC bus of the converter and the common reference point through a current sensor, the common leg can be controlled independently from the control of the other legs. Because of the inductor, the current ripples are reduced as well. Moreover, this invention discloses a systematic framework to arrange voltage sensors and current sensors with a common reference point for measurement, making it possible to use low-cost, small-size, and non-isolated voltage and current sensors. Because of the small resistance of current sensors, this common reference point for measurement can also be directly connected to the neutral point of the utility or the negative rail of DC sources/loads. This presents a significant step forward for power electronic converters, with the potential of reducing EMI filters considerably and removing isolation transformers.

BRIEF DESCRIPTION OF THE DRAWINGS

The accompanying figures further illustrate the disclosed embodiments and, together with the detailed description of the disclosed embodiments, serve to explain the principles of the present invention.

DETAILED DESCRIPTION

Figure 1:
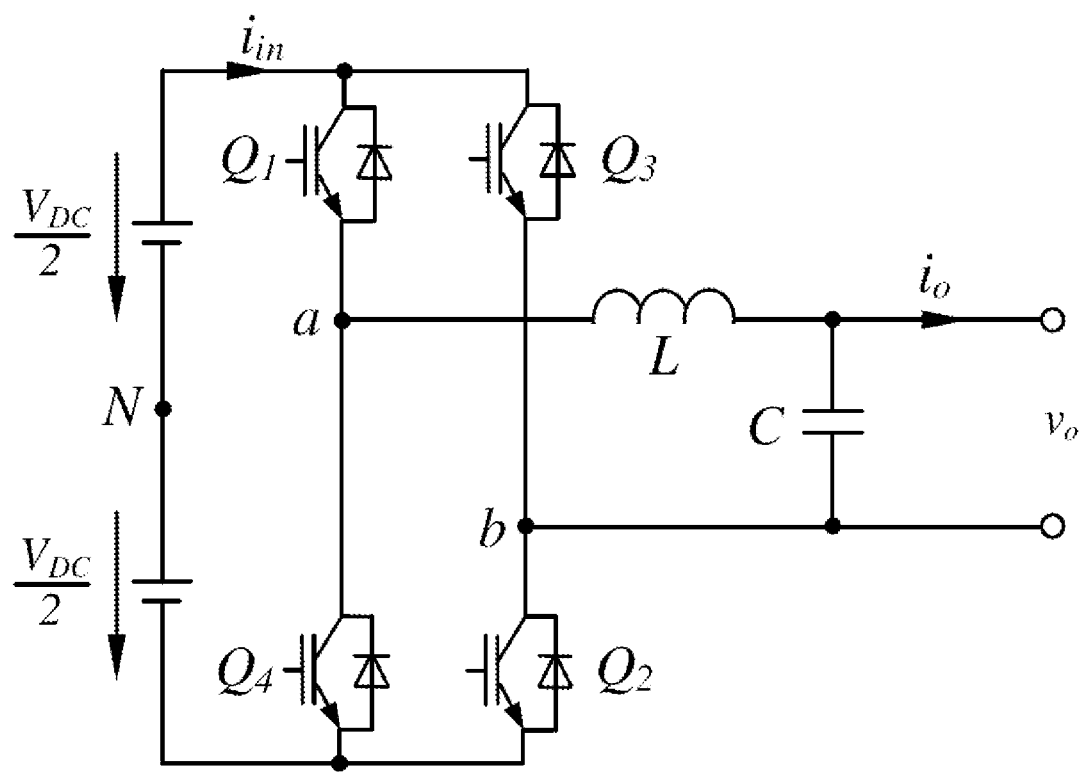
FIG. 1 shows the conventional single-phase converter.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. used herein does not necessarily refer to a different embodiment. It is intended, for example, that claimed subject matter include combinations of example embodiments in whole or in part.

In general, terminology may be understood at least in part from usage in context. include a variety of meanings that may depend at least in part upon the context in which such terms are used. to mean A, B, and C, here used in the inclusive sense, as well as A, B, or C, here used in the exclusive sense. in part upon context, may be used to describe any feature, structure, or characteristic in a singular sense or may be used to describe combinations of features, structures or characteristics in a plural sense. to convey a singular usage or to convey a plural usage, depending at least in part upon context. to convey an exclusive set of factors and may, instead, allow for existence of additional factors not necessarily expressly described, again, depending at least in part on context.

Overview of the Conventional Bridge Converter

FIG. 1 illustrates a conventional single-phase PWM-controlled converter. It can be operated as a rectifier if an AC supply is connected to $v_o$ or as an inverter if a DC supply $V_{DC}$ is connected to the DC side. It uses four power semiconductor devices $Q_1$~$Q_4$. Different power semiconductor devices, such as MOSFET and IGBT, can be adopted. They can be normal silicon devices or the emerging wide bandgap devices, depending on the applications. $Q_1$ and $Q_4$ form a conversion leg and $Q_3$ and $Q_2$ form another leg. The devices on the same leg are operated complementarily so that the voltage $v_{ab}$ is pulse-width-modulated with the fundamental component equal to the desired voltage. The inductor L and the capacitor C are used to filter out switching ripples.

This topology has been widely used in industry for motor drives, renewable energy, EVs and so on. However, it often needs an isolation transformer for safety reasons, which leads to increased cost, weight and volume. Moreover, there is often a need of having a bulky electrolytic capacitor on the DC bus to reduce the voltage ripples. Again, this increases the cost, weight and volume of the converter. What is even worse is that electrolytic capacitors have limited lifetime, becoming the most vulnerable component in a converter. Furthermore, there is a need to add common-mode filters to reduce EMI. Last but not the least, the cost of current and voltage sensors needed may be high, due to the lack of a common reference point for the voltages and the currents to be measured. The voltage and current sensors have to be isolated ones, which are expensive and bulky.

The Disclosed Invention

Figure 2:
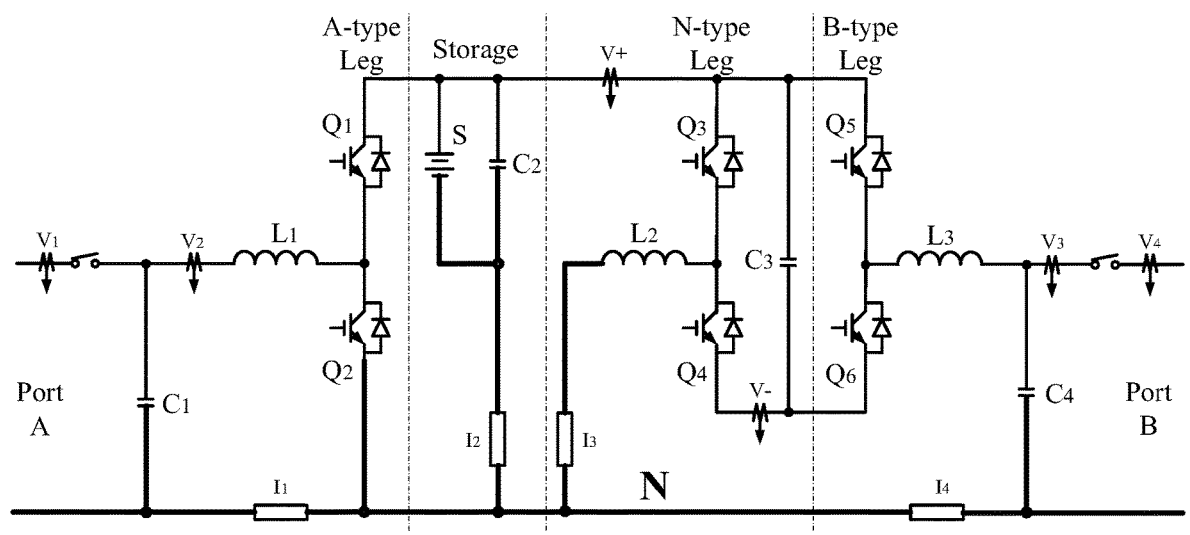
FIG. 2 illustrates an example of the disclosed SYNDEM converter topology, where all current sensors $I_1$~$I_4$ and voltage sensors $V_1$~$V_4$, $V_+$, and $V_-$ all have one terminal connected to the common reference point N. Note that the voltage sensors are shown at the point where the voltages are measured together with an arrow pointing to the common reference point without actually showing the wires connected to the common reference point N.

FIG. 2 shows an example of the disclosed SYNDEM converter. It involves in three types of power electronic conversion legs, denoted A-type, N-type and B-type to facilitate the presentation. It contains three ports: Port A, Port S and Port B. The Port S is for the connection of storage systems S, such as batteries and super-capacitors, or DC loads. The simplest case is that there is no storage system or DC load connected. Port A and Port B are used for the connection of supplies and/or loads. Port A and Port B can be of AC or DC, depending on the application. For example, for grid-connected PV applications, Port A can be connected to PV panels while Port B is connected to the grid. In this case, Port A is of DC and Port B is of AC. When the converter is used to connect two DC supplies or loads, then both Port A and Port B are of DC. Hence, an innovative aspect of the disclosed SYNDEM converter is its versatility. Another innovative aspect of the disclosed SYNDEM converter is that the current sensors and the voltage sensors needed are arranged in a way to have a common reference point N for measurement. This significantly simplifies the measurement of currents and voltages needed for control, making it possible to use non-isolated voltage and current sensors to reduce cost and volume. Moreover, because the current sensors have very small resistance, this common reference point N is also common to the supply and the load, as highlighted by the thick lines in FIG. 2. This significantly reduces leakage current and common-mode voltage, which enhances safety.

At the center of the converter, it is the N-type conversion leg that consists of power electronic devices $Q_3$ and $Q_4$ with their mid-point connected to the common reference point N through the inductor $L_2$ and the current sensor $I_3$ and with their both ends connected to capacitor $C_3$, which supports the DC bus. The voltages of the two ends of the N-type leg with respect to the common reference point N, denoted as $V_+$ and $V_-$ respectively, can be measured with voltage sensors. They together make up the DC-bus voltage across the capacitor $C_3$ as $V_{DC}=V_+-V_-$.

The right part of FIG. 2 is the B-type conversion leg that consists of power electronic devices $Q_5$ and $Q_6$ with their both ends connected across the DC bus, and with their mid-point connected to Port B through the inductor $L_3$, capacitor $C_4$, and a circuit breaker (or relay). Port B and capacitor $C_4$ are connected to the common point N through a current sensor $I_4$. The circuit breaker (or relay) or even the capacitor $C_4$ may not be present, depending on the application. Note that the current measured is also the current following through the inductor $L_3$. The voltages across the Port B and/or the capacitor $C_4$ if present can be measured with respect to the common reference point because the resistance of the current sensor is small. Depending on the application, there may be multiple or no B-type legs. For example, there are three B-type legs for three-phase applications, two B-type legs for split-phase applications, and one B-type leg for single-phase applications. When there are multiple B-type legs, all the B-type legs are connected to the common reference point N through individual current sensors, respectively, in the same way as illustrated in FIG. 2 for the B-type leg.

The left part of FIG. 2 is the A-type conversion leg that consists of power electronic devices $Q_1$ and $Q_2$ with the port being Port A. The A-type leg is connected between the positive rail of the DC bus and the common reference point N. A distinctive feature is that it is not connected to the negative rail of the DC bus. The mid-point of the A-type leg is connected to Port A through the inductor $L_1$, capacitor $C_1$, and a circuit breaker (or relay). The circuit breaker (or relay) or even the capacitor $C_1$ may not be present, depending on the application. Port A and capacitor $C_1$ are connected to the common reference point N through a current sensor $I_1$. Note that the current measured by the current sensor $I_1$ is also the current following through the inductor $L_1$. The voltages across the Port A and/or the capacitor $C_1$ if present can be measured with respect to the common reference point N because the resistance of the current sensor is small. Depending on the application, there may be multiple or no A-type legs. For example, there can be three A-type legs if three strings of PV panels are connected to their Port A, respectively. Another example is that there is no A-type leg needed for a grid-tied storage system. When there are multiple A-type legs, all the A-type legs are connected to the common reference point N through individual current sensors, respectively, in the same way as illustrated in FIG. 2 for the A-type leg.

The storage Port S has a capacitor $C_2$ connected in parallel, which together are connected between the positive rail of the DC bus and the common reference point N through a current sensor $I_2$. The storage Port S can also be used to connect a load as well if needed. Note that the voltage $V_+$ is the voltage across the capacitor $C_2$ because the resistance of the current sensor $I_2$ is very small.

The voltage and current sensors may be isolated or non-isolated ones. An example is to use current-sense

TABLE I

| System parameters | |
|---|---|
| Parameters | Values |
| $L_1$, $L_2$, $L_3$, | 1 mH |
| Rated power | 3 kVA |
| Grid voltage | 120 V |
| Grid frequency | 60 Hz | resistors for current sensing and resistive voltage dividers for voltage sensing, which significantly reduces the complexity, cost and size of the circuit. When non-isolated sensors are used, the common reference point N is also the common ground of the control circuitry. This significantly simplifies system design, improves power density, and reduces common-mode voltage and leakage current.

The power electronic devices used in the converter can be any power electronic switches, such as transistors, IGBT, and MOSFET, and can be selected according to the need of the application. They can be conventional devices, emerging devices such as SiC and GaN wide bandgap devices, or future devices. Each device can be a single device or a set of devices in parallel, series or their combination. The inductors can be implemented with different types of inductors, including the stray inductance of wires and/or tracks on printed circuit boards.

Validation with Computational Simulations

As an example, the disclosed SYNDEM converter is adopted and validated for a grid-tied PV-storage system, with PV panels connected to Port A, batteries connected to Port S and the grid connected to Port B. Some of the system parameters are given in Table I.

Figure 3:
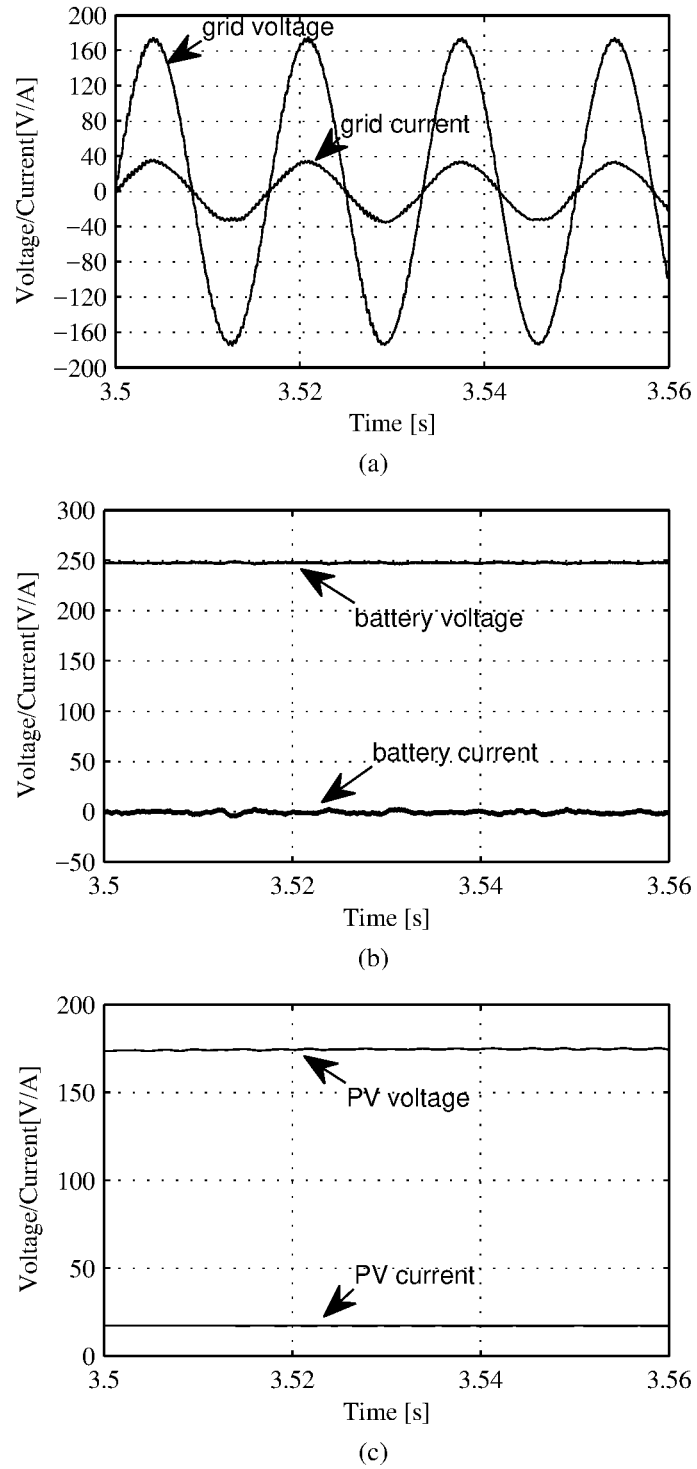
FIG. 3 illustrates the simulation results of the disclosed SYNDEM converter operated as a grid-tied PV-storage system: (a) the voltage and current at Port B (the grid); (b) the voltage and current at the storage Port S; (c) the voltage and current at the Port A (the PV).

Some of the curves from the simulation are shown in FIG. 3. The voltage and current of Port B, i.e., at the interface with the grid, as shown in FIG. 3(a), behave very well, with small harmonics and close to the rated voltage. The voltage of the battery is more or less constant, as shown in FIG. 3(b) because the power extracted from the PV panels is directly sent to the grid. Indeed, the battery current is around 0. The voltage and current of Port A, i.e., at the PV output, as shown in FIG. 3(c), are more or less constant because the irradiation is constant.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. A power electronic converter with a plurality of voltage sensors, a plurality of current sensors, and a plurality of ports, comprising
   a common reference point (N) to which the voltage and current sensors are connected directly and to which the ports are connected through current sensors;
   an N-type power electronic conversion leg that consists of two power electronic devices connected in series with positive and negative ends of the N-type conversion leg connected to a first capacitor to form a DC bus and a mid-point of the N-type conversion leg connected to an inductor and further through a first current sensor to the common reference point (N); and
   at least one additional power electronic conversion leg that consists of two power electronic devices in series with a positive end connected to a positive rail of the DC bus and a negative end connected either to the common reference point (N), in which case the power electronic conversion leg is denoted an A-type, or to the negative rail of the DC bus, in which case the power electronic conversion leg is denoted a B-type;
   wherein for each of the additional power electronic conversion leg, a second current sensor is connected directly between the common reference point (N) and a corresponding external port.

2. The power electronic converter as claimed in claim 1, further comprising a second capacitor connected directly with one end to the DC bus and the other end to the common reference point (N).

3. The power electronic converter as claimed in claim 2, further comprising a third current sensor connected between the second capacitor and the common reference point (N).

4. The power electronic converter as claimed in claim 1 in which one or more voltage sensors are connected to the other end of any of the current sensors that have one end connected to the common reference point (N).

5. The power electronic converter as claimed in claim 2, further comprising a storage system in parallel with the second capacitor.

6. The power electronic converter as claimed in claim 2, further comprising a DC load in parallel with the second capacitor.

7. The power electronic converter as claimed in claim 1 in which the port corresponding to each present A-type power electronic conversion leg is connected to a DC supply or a DC load.

* * * * *